United States Patent [19]

Yoh

[11] Patent Number: 4,954,730
[45] Date of Patent: Sep. 4, 1990

[54] COMPLEMENTARY FET CIRCUIT HAVING MERGED ENHANCEMENT/DEPLETION FET OUTPUT

[75] Inventor: Kanji Yoh, Osaka, Japan

[73] Assignee: The Board of Trustees of the Leland Stanford Junior University, Stanford, Calif.

[21] Appl. No.: 342,224

[22] Filed: Apr. 21, 1989

[51] Int. Cl.⁵ .................. H03K 19/094; H03K 17/12; H03K 19/092; H03K 17/687

[52] U.S. Cl. ................................. 307/451; 307/443; 307/450; 307/542; 307/544; 307/581; 307/585; 307/296.5

[58] Field of Search ............... 307/443, 478, 450, 451, 307/475, 471, 542, 544, 581, 584, 585, 482, 578, 296.5, 296.8

[56] References Cited

U.S. PATENT DOCUMENTS

| | | | |
|---|---|---|---|
| 4,463,270 | 7/1984 | Gordon | 307/296.5 |
| 4,479,067 | 10/1984 | Fujita | 307/448 X |
| 4,553,043 | 11/1985 | Parker | 307/450 X |
| 4,724,342 | 2/1988 | Sato et al. | 307/448 X |
| 4,725,743 | 2/1988 | Anderson et al. | 307/448 X |
| 4,725,746 | 2/1988 | Segawa et al. | 307/578 X |
| 4,767,950 | 8/1988 | Schrenk | 307/581 X |
| 4,798,978 | 1/1989 | Lee et al. | 307/450 |
| 4,877,976 | 10/1989 | Lach et al. | 307/450 |
| 4,885,479 | 12/1989 | Oritani | 307/443 |

Primary Examiner—Stanley D. Miller
Assistant Examiner—David R. Bertelson
Attorney, Agent, or Firm—Henry K. Woodward

[57] ABSTRACT

A merged enhancement/depletion-mode FET circuit and a complementary FET logic circuit have enhanced operation speed and reduced power dissipation. Serially connected depletion mode and enhancement mode transistors function as an output stage for the complementary FET logic stage, with the gate of an n-channel enhancement-mode transistor being connected to the output of the complementary FET logic stage and the output of an n-channel depletion-mode transistor being connected to the common terminal or output terminal of the output stage. In an alternative embodiment, a p-channel enhancement-mode transistor is connected in parallel with the n-channel depletion-mode transistor with the gate of the p-channel enhancement-mode transistor being connected to the output of the complementary FET logic stage. The circuitry is particularly useful in compound semiconductor circuits using MES-FETS and heterojunction-FETs.

12 Claims, 1 Drawing Sheet

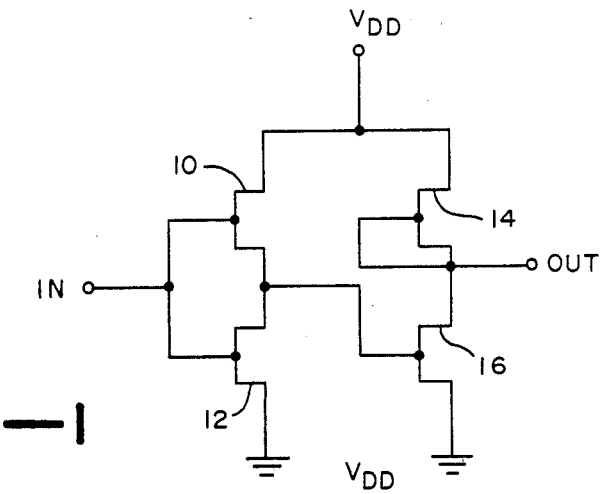
FIG.—1
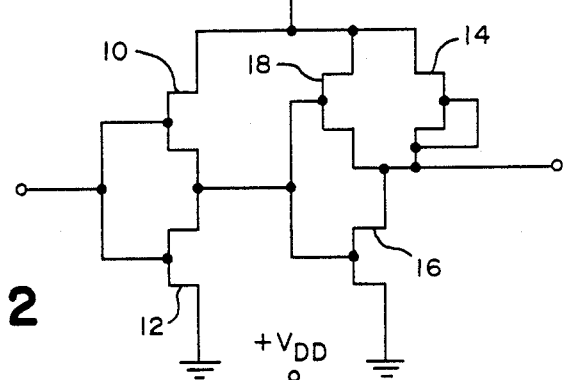
FIG.—2
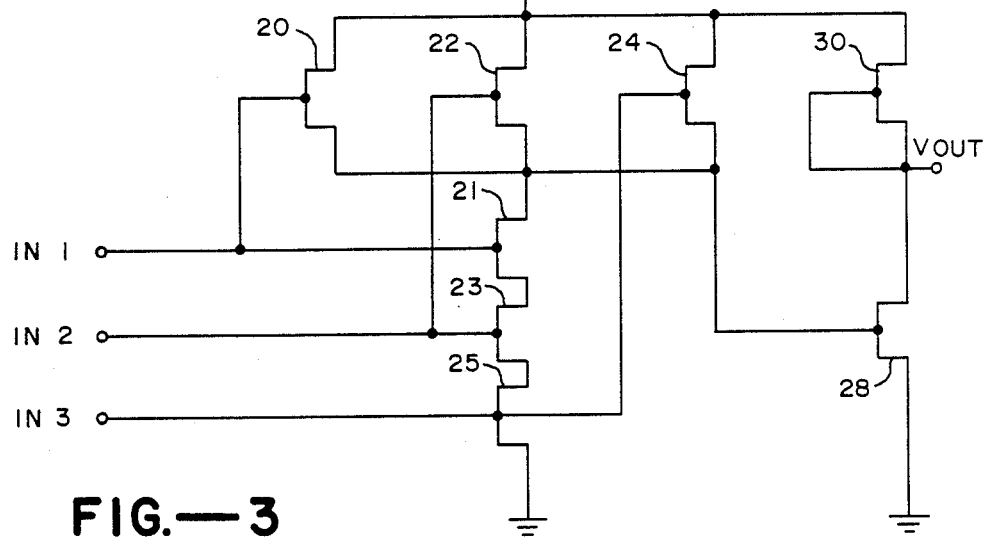
FIG.—3

COMPLEMENTARY FET CIRCUIT HAVING MERGED ENHANCEMENT/DEPLETION FET OUTPUT

BACKGROUND OF THE INVENTION

This invention relates generally to semiconductor field-effect transistor (FET) circuits, and more particularly the invention relates to complementary FET logic circuits fabricated in compound semiconductor material.

Limitations of FET circuitry formed in compound semiconductor material such as gallium arsenide are speed and power dissipation. Interconnect lines at high fan-out increase the capacitive loading of complementary FET logic circuitry, thus increasing propagation time and reducing noise margin. FET circuits using only enhancement and depletion mode transistor pairs have increased power dissipation. In silicon logic circuits these problems have been minimized by merging bipolar and MOS devices, thereby achieving high current capabilities of the bipolar devices and the low power consumption of CMOS technology. Heretofore, however, compound semiconductor FET logic circuits have retained speed and power limitations.

SUMMARY OF THE INVENTION

An object of the present invention is FET logic circuitry having enhanced speed and reduced power dissipation.

Another object of the invention is complementary FET logic circuitry having enhanced speed and propagation time when operating into a heavy capacitive load.

Still another object of the invention is FET logic circuitry employing enhancement/depletion mode transistor output having reduced power dissipation.

A feature of the invention is the use of enhancement/depletion mode FET output circuitry with complementary FET logic circuitry.

Briefly, in a preferred embodiment, complementary enhancement-mode FET circuitry is provided in a compound semiconductor structure. The FET devices can be MESFETs or heterostructure devices. The output of the circuitry is applied to an enhancement/depletion circuit functioning as an output for the complementary FET circuit.

More particularly, the output stage includes an n-channel depletion-mode transistor serially connected with an n-channel enhancement-mode transistor between positive and negative (or ground) potentials with the common node of the two transistors functioning as an output. The output signal from the complementary FET circuitry is connected to the gate electrode to the enhancement-mode transistor. The gate electrode of the depletion-mode transistor is connected to the output terminal. A positive output from the complementary FET circuitry causes the enhancement mode transistor of the output circuitry to conduct, thereby applying a ground or a negative potential to the output and causing the depletion-mode transistor to cut off. Conversely, a ground or negative output from the complementary FET circuitry renders the enhancement-mode transistor nonconductive and a positive voltage is applied through the depletion-mode transistor.

In an alternative embodiment, a p-channel enhancement-mode transistor is connected in parallel with the n-channel depletion-mode transistor of the output circuit. The gate of the p-channel enhancement-mode transistor is connected to receive the output of the complementary logic circuit along with the gate of the n-channel enhancement-mode transistor.

In either embodiment the enhancement/depletion mode FET circuitry of the output increases circuit speed in driving a heavy capacitive load while the complementary FET logic circuit reduces power dissipation as compared to enhancement/depletion-mode logic circuits.

The invention and objects and features thereof will be more readily apparent from the following detailed description and appended claims when taken with the drawing.

BRIEF DESCRIPTION OF THE DRAWING

FIG. 1 is a schematic of merged enhancement/depletion-mode FET output stage with a complementary FET logic inverter.

FIG. 2 is a schematic of an alternative configuration of a merged enhancement/depletion-mode FET output stage with a complementary FET logic inverter.

FIG. 3 is a schematic of a three-input AND gate including an enhancement/depletion-mode logic inverter and a complementary NAND FET gate.

DETAILED DESCRIPTION OF ILLUSTRATIVE EMBODIMENTS

Referring now to the drawing, FIG. 1 is a schematic of one embodiment of the invention in which complementary FET logic circuitry drives a merged enhancement/depletion-mode FET output. The complementary logic circuit is an inverter comprising a p-channel enhancement-mode transistor 10 serially connected with an n-channel enhancement-mode transistor 12 between a positive voltage potential ($V_{DD}$) and ground. An input signal applied to the gates of transistors 10 and 12 is inverted at the output of the complementary inverter taken at the common node of transistors 10 and 12.

An output stage for the logic circuitry includes an n-channel depletion-mode transistor 14 and an n-channel enhancement-mode transistor 16 which are serially connected between $V_{DD}$ and ground. The gate of the depletion-mode transistor 14 is connected to the output taken at the common node of transistors 14 and 16, while the output from the complementary FET logic inverter is applied to the gate of the enhancement-mode transistor 16.

In operation, the inverted output from transistors 10, 12 is again inverted by the depletion/enhancement-mode circuit. When the input to the circuitry is positive, the output of transistors 10, 12 is at ground potential which maintains enhancement-mode transistor 16 in a nonconducting state. Depletion-mode transistor 14 is then conducting and applies a positive signal to the output. Conversely, when the input is at ground (or negative), transistor 12 is nonconductive and transistor 10 conducts, thereby applying a positive voltage at the common node of transistors 10, 12. The positive potential drives enhancement-mode transistor 16 conductive, thereby applying a ground potential at the output. The ground potential is also applied to the gate of depletion-mode transistor 14, thereby rendering transistor 14 nonconductive.

FIG. 2 is a schematic of an alternative embodiment of the enhancement/depletion-mode output stage illustrated in FIG. 1, and like elments have the same reference numerals. In this embodiment, a p-channel enhancement-mode transistor 18 is connected in parallel with the n-channel depletion-mode transistor 14. The output of the complementary transistor logic inverter is applied to the gate of transistor 18 and to the gate of n-channel enhancement-mode transistor 16. The provision of transistor 18 enhances the current-carrying capacity, and thus the speed, of the output stage while adding incrementally to the power dissipation thereof.

FIG. 3 is a schematic of a three-input AND gate circuit including an enhancement/depletion-mode output and a complementary NAND gate input. The NAND gate includes complementary transistor pair 20, 21, pair 22, 23, and pair 24, 25 with the p-channel transistors 20, 22, 24 connected in parallel and the n-channel transistors 21, 23, 25 connected in series with each other and with the parallel transistors 20, 22, 24. Each of the three inputs to the logic circuitry is applied to the gate of a p-channel transistor and an n-channel transistor. The output of the complementary logic NAND circuit is connected to the gate of n-channel enhancement-mode transistor 28. Transistor 28 is serially connected with n-channel depletion-mode transistor 30 between ground and the positive voltage potential ($V_{DD}$), similar to the circuits of FIGS. 1 and 2. Again, the gate of depletion-mode transistor 30 is connected to the output terminal taken at the common node of transistors 28 and 30.

As illustrated in the three embodiments of FIGS. 1-3, the invention employs an enhancement/depletion-mode FET output stage merged with a complementary FET logic circuit to provide enhanced speed for the complementary logic circuitry and lower power dissipation for a corresponding enhancement/depletion-mode type logic circuit. Thus, propagation time of the output node with heavy capacitive loads is improved while keeping the noise margin high. The invention is particularly applicable to compound semiconductor devices such as gallium arsenide MESFETs and gallium arsenide heterostructure transistors.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

I claim:

1. An FET circuit comprising
a complementary FET circuit including at least one pair of serially connected complementary enhancement-mode transistors having a common terminal therebetween and with an output terminal at said common terminal, and
an output circuit including a first depletion-mode transistor serially connected with a first enhancement-mode transistor and having a common terminal therebetween, said first enhancement-mode transistor having a gate electrode connected to said output terminal of said complementary FET circuit, the first depletion-mode transistor having a gate electrode connected to said common terminal of said first serially connected depletion-mode transistor and said first enhancement-mode transistor, the output terminal of said output circuit being said common terminal.

2. The FET circuit as defined by claim 1 wherein said output circuit is connectable between a first voltage potential and a second voltage potential at a lower voltage potential than said first voltage potential, said first depletion-mode transistor being connectable to said first voltage potential and said first enhancement-mode transistor being connectable to said second voltage potential.

3. The FET circuit as defined by claim 2 wherein said first enhancement-mode transistor and said first depletion-mode transistor of said output circuit are n-channel MESFETs formed in compound semiconductor material.

4. The FET circuit as defined by claim 2 wherein said first enhancement-mode transistor and said first depletion-mode transistor of said output circuit are n-channel heterojunction FETs formed in compound semiconductor material.

5. The FET circuit as defined by claim 2 wherein said output circuit further includes a second enhancement-mode transistor connected in parallel with said first depletion-mode transistor and having a gate electrode connected to said output terminal of said complementary FET circuit, said first enhancement-mode transistor being n-channel, said first depletion-mode transistor being n-channel, and said second enhancement-mode transistor being p-channel.

6. The FET circuit as defined by claim 1 wherein said complementary FET circuit is an inverter circuit with said serially connected complementary transistors having gate electrodes connected to an input terminal.

7. The FET circuit as defined by claim 1 wherein said complementary FET circuit comprises a logic circuit.

8. For use with a complementary FET circuit, an output circuit comprising a first depletion-mode transistor serially connected with a first enhancement-mode transistor with said serially connected transistors having a common terminal therebetween, said enhancement-mode transistor having a gate electrode connected to an output terminal of the complementary FET circuit, said first depletion-mode transistor having a gate electrode connected to said common terminal, the output terminal of said output circuit being said common terminal.

9. The output circuit as defined by claim 8 and further including a first voltage potential and a second voltage potential at a lower voltage potential than said first voltage potential, means connecting said depletion-mode transistor to said first voltage potential and means connecting said enhancement-mode transistor to said second voltage potential.

10. The output circuit as defined by claim 9 wherein said enhancement-mode transistor and said depletion-mode transistor are n-channel MESFETs formed in compound semiconductor material.

11. The output circuit as defined by claim 9 wherein said first enhancement-mode transistor and said first depletion-mode transistor are n-channel heterojunction FETs formed in compound semiconductor material.

12. The output circuit as defined by claim 8 and further including a second enhancement-mode transistor connected in parallel with said first depletion-mode transistor and having a gate electrode connected to the output terminal of the complementary FET circuit, said first enhancement-mode transistor being n-channel, said first depletion-mode transistor being p-channel, and said second enhancement-mode transistor being p-channel.

* * * * *